(12) United States Patent
Patwardhan

(10) Patent No.: US 10,408,869 B1
(45) Date of Patent: Sep. 10, 2019

(54) ELECTRICAL CONNECTION VALIDATION SCHEME

(71) Applicant: Satyajit Patwardhan, Fremont, CA (US)

(72) Inventor: Satyajit Patwardhan, Fremont, CA (US)

( * ) Notice: Subject to any disclaimer, the term of this patent is extended or adjusted under 35 U.S.C. 154(b) by 22 days.

(21) Appl. No.: 15/844,551

(22) Filed: Dec. 17, 2017

(51) Int. Cl.
*G01R 31/04* (2006.01)
*G01R 27/20* (2006.01)

(52) U.S. Cl.
CPC ......... *G01R 27/205* (2013.01); *G01R 31/045* (2013.01)

(58) Field of Classification Search
CPC .................................................. G01R 27/205
See application file for complete search history.

(56) References Cited

U.S. PATENT DOCUMENTS

2004/0041581 A1* 3/2004 Saijyo ....................... G01R 3/00 324/754.03

* cited by examiner

*Primary Examiner* — Clayton E. LaBalle
*Assistant Examiner* — Jas A Sanghera

(57) ABSTRACT

In the modern world, electricity has become ubiquitous. Electrical connectors that connect and disconnect the electricity from the end use device have become important. If the connector has established a good quality contact across its mating conductors, there is no cause for concern. Also, if the connector has not established any contact with associated contacts being far away, then also there is no cause for a safety concern. However, when a connector has established marginal contact between the source and drain side contacts, and if the load and the source are switched on, the possibility of an arc across the thin layer of oxide separating the two contacts is high. This invention teaches a method to measure the quality of electrical connection established across an electrical connector. The method described here can be used to ascertain the quality of the connection before turning on the current across the connection.

1 Claim, 4 Drawing Sheets

ELECTRICAL CONNECTION VALIDATION SCHEME

FIELD OF THE INVENTION AND BACKGROUND

The general field of invention is electrical connector design. In particular this invention teaches an intelligent power connector that can verify itself after a connection is established. FIG. 1 shows a typical power connector prevalent in prior art. Such a connector is made of two halves 1 and 2. One of the two halves (1 in this example) is electrically connected to the electricity source and the other half (2 in this example) is connected to electrical load. Collectively, these two halves carry two or more pairs of contacts that will contact with each other when the two connector halves mate. FIG. 1, shows two such pairs 6A-6B and 7A-7B. FIG. 2 shows the connector of FIG. 1 with its two halves mating with each other. The wiring connecting to and from the connectors to electricity source and load respectively may optionally include switch S2 and S4. These two switches offer additional means of disconnecting electrical energy. In the prior art, there is no description of any means of protecting against the situation when one or all of the contact pairs 6A-6B or 7A-7B have established only a marginal electrical contact. Such marginal connection is signified by a high value of contact resistance and has a potential of creating excessive heat at the contact interface. Each time connector halves 1 and 2 mate, the actual value of the contact resistance across the pairs 6A-6B and 7A-7B changes. Hence, in the ideal scenario, each time a power connector's two halves are put together, one should measure the contact resistance across 6A-6B and 7A-7B and ascertain if the contact resistance is small enough to not cause any hazard. However, if one has to use prior art in measuring the contact resistance of any one of the pairs 6A-6B or 7A-7B, one has to attach a voltmeter 9 and ammeter 8 as shown in FIG. 2. One of the biggest problem in this arrangement is that voltmeter 9 needs access to two halves 1 as well as 2 of the power connector. This drawback prevents an automated computerized scheme to seamlessly measure and then report the contact quality. In a computerized or automated measurement scheme, the voltmeter—or its equivalent and ammeter—or its equivalent have to report their measurements to a microprocessor or equivalent control unit, which can combine these two measurements into contact resistance.

This drawback cannot be solved by either:
a) Creating an auxiliary contact pair—just for the purposes of giving voltmeter access to the other element in the contact 7A-7B (or 6A-6B—whichever the case be). This auxiliary contact pair itself will need verification since any high resistance created across the auxiliary pair would falsely under-report the resistance of contact pair under verification (7A-7B in this case). This will be an unacceptable situation from the safety viewpoint.
b) Measure the voltage on either side of 7A-7B with respect to some common voltage, by two voltmeters located on two halves 1 and 2 of the power connector. This is also not feasible because the voltage difference across 7A-7B is likely to be a very small voltage. Measuring the two voltages using two independent voltmeters, as well as the inaccuracies of locating a reliable and high quality common voltage as a reference for both of these independent voltmeters will add significant inaccuracies in the overall measurement of an extremely small voltage across 7A-7B. This will render the contact resistance measurement inaccurate to the point of being unusable.

It should be noted that above analysis equally applies to more advanced methods of resistance measurement—such as 4 wire Kelvin Bridge, all of which also need a direct access to both sides of the resistance under measurement. Consequently, the limitation posed in prior art continues to hamper any direct measurement of resistance of a contact pair.

PRIOR ART RELATED TO THE INVENTION

Review of the prior art in the cooperative patent classification, under the class H02H1/003 reveals several active circuit and switching element configurations intended for detecting faults in load or in the wiring leading to the load. For example, (i) U.S. Pat. No. 9,705,493 describes how to detect an unintentional shot circuit or a human being unintentionally touching two live wires, (ii) U.S. Pat. No. 9,547,032 describes how to detect a ground current and ground fault, (ii) U.S. Pat. No. 9,535,104 describes how to detect arc fault, (iii) U.S. Pat. No. 6,603,290 describes islanding detection scheme, (iv) U.S. Pat. No. 9,350,156B2 describes a scheme of using and controlling two series switches one on each side of the load terminal. The list goes on, however none of these schemes attempt to directly ascertain the quality of the connections in a power connector.

DETAILED DESCRIPTION OF THE INVENTION

As discussed earlier, it is very difficult to make a direct measurement of the contact resistance of a power connector. However, as described below, the key innovations of this invention enable measurement of a value closely related to the individual measurements of contact resistance.

Figure 1:
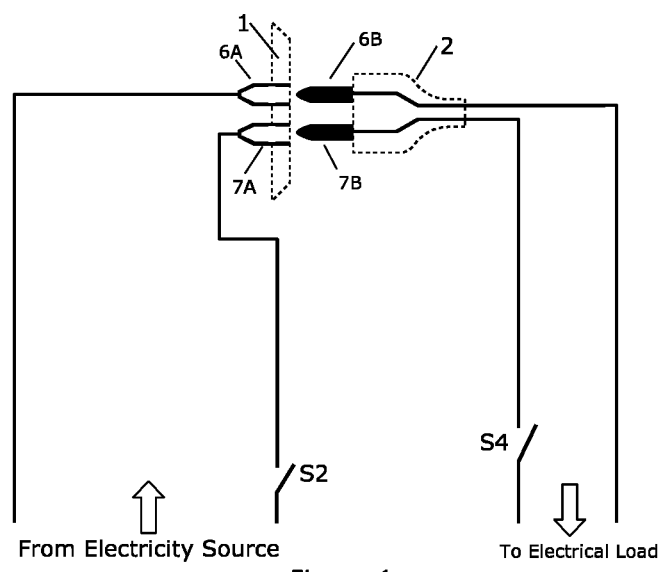
FIG. 1: Typical electrical power connector prevalent in prior art: Disconnected position
Figure 2:
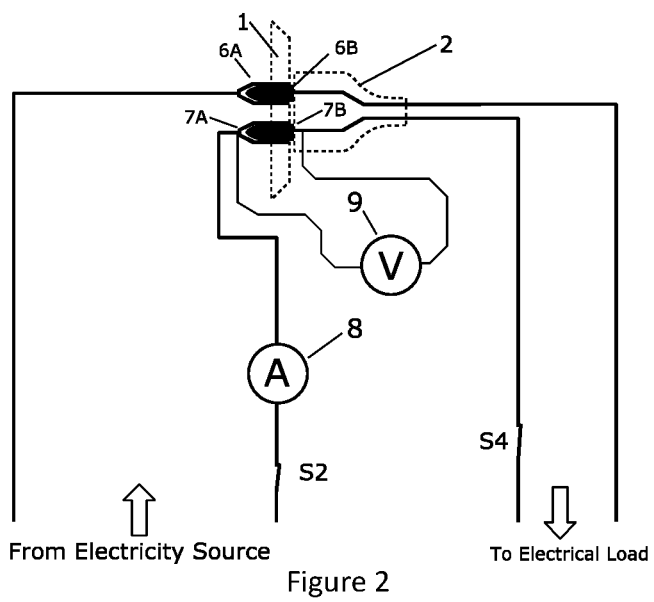
FIG. 2: Typical electrical power connector prevalent in prior art: Connected position, and a basic but impractical scheme to measure contact resistance of one of the contact pairs.
Figure 3:
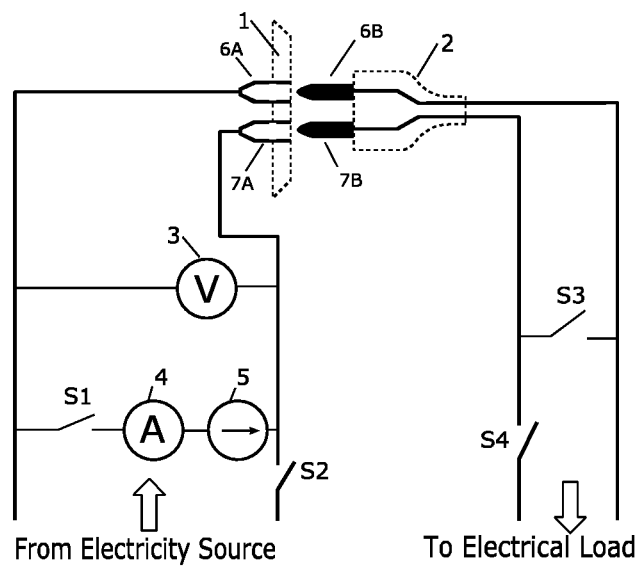
FIG. 3: Electrical power connector with connection quality measurement circuit: Step1

The Arrangement:

The innovation taught in this application uses the fact that it is usually not necessary to measure contact resistance of individual pairs of contacts. For example, in FIG. 2, it is not necessary to measure the contact resistance of pairs 6A-6B and 7A-7B individually. However, if one can measure the sum of the resistance of these two contact pairs, it is a sufficiently strong indicator of the overall quality of the electrical contact established by the connector. This measurement can be made possible by a second innovation which is introduction of a shunt switch S3 to selectively short circuit one of the sides of the contact pair. For example, in the embodiment shown in FIG. 3, the switch S3 is shorting 6B and 7B connectors. Additional elements of the embodiment shown in FIG. 3 are a voltmeter 3, an ammeter 4, a current source 5 and the switches S1, S2, S3 and S4.

The Operation:

The entire sequence of contact quality check begins right after the two halves 1 and 2 are brought to mate with each other. The sequence can be automated with appropriate microprocessors on both halves 1 and 2 and appropriate communication means between the two microprocessors. Or it can be fully manual. The exact means of orchestrating the sequence—manual or automated, is not relevant part of this innovation. The steps of contact verification are summarized in following paragraph. Please note that the specific steps listed below, represent conceptual description of the process of ascertaining contact quality and there are several variants of these steps that can also work.

Step 1: The first step us to set up the overall switch configuration to a safe state prior to connecting the two halves 1 and 2 of the connector. This is shown in FIG. 3. The switches S1, S2, S3 and S4 are set in "open" position.

Figure 4:
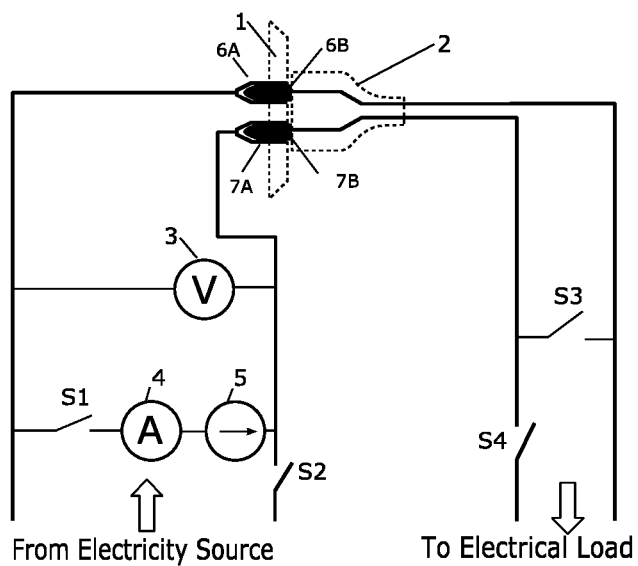
FIG. 4: Electrical power connector with connection quality measurement circuit: Step2

Step 2: The two halves 1 and 2 of the connector are made to mate. This is shown in FIG. 4.

Figure 5:
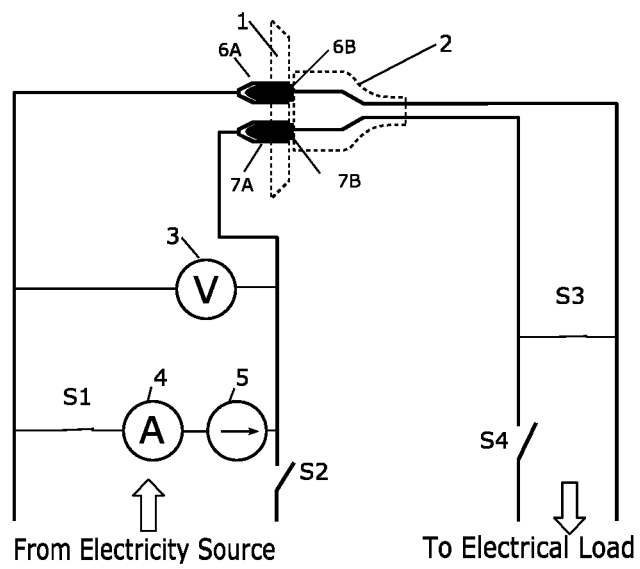
FIG. 5: Electrical power connector with connection quality measurement circuit: Step3
Figure 6:
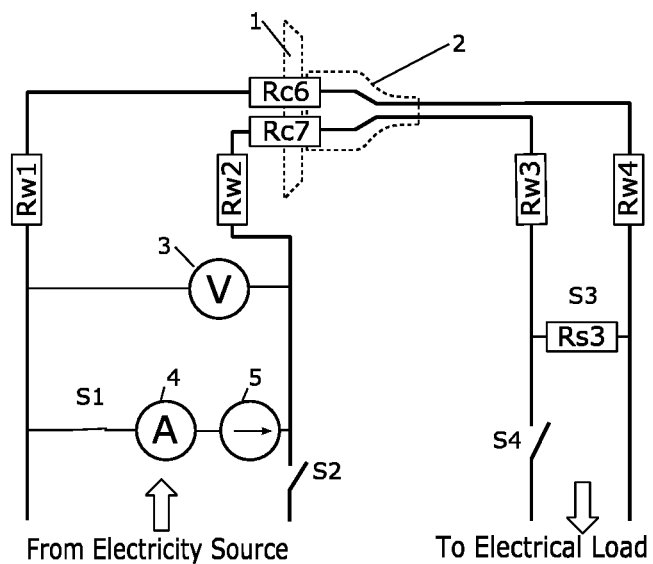
FIG. 6: Electrical power connector with connection quality measurement circuit: Step3

Step 3: The switches S1 and S3 are "closed". This is shown in FIG. 5. The electrical energy from current source 5 passes through the pair of contactors 6A-6B and 7A-7B. The voltage V reported by voltmeter 3 and current A reported by ammeter 4 is recorded. The electrical resistance V/A will be $Rw1+Rc6+Rw4+Rs3+Rw3+Rc7+Rw2$ (see FIG. 6). This resistance is composed of a fixed part: $(Rw1+Rw2+Rw3+Rw4+Rs3)$, and a component $(Rc6+Rc7)$ that changes from one engagement event to another. Here, Rw1, Rw2, Rw3 and Rw4 are wiring resistances of different parts of the wiring leading to and from the power connector. Rs3 is the resistance of the shunt switch S3 in its closed position. Rc6 and Rc7 are the contact resistances of the two contact pairs 6A-6B and 7A-7B respectively. The value of $(Rw1+Rw2+Rw3+Rw4+Rs3)$ can be pre-measured at factory and stored in the memory of the microprocessor performing the contact validation sequence. Or it can be shipped as calibration data if a manual validation process is followed. Thus $(Rc6+Rc7)$ can be computed by $V/A-(Rw1+Rw2+Rw3+Rw4+Rs3)$, where V and A are measured each time the two contact halves are mated, and $(Rw1+Rw2+Rw3+Rw4+Rs3)$ comes from factory calibration.

Figure 7:
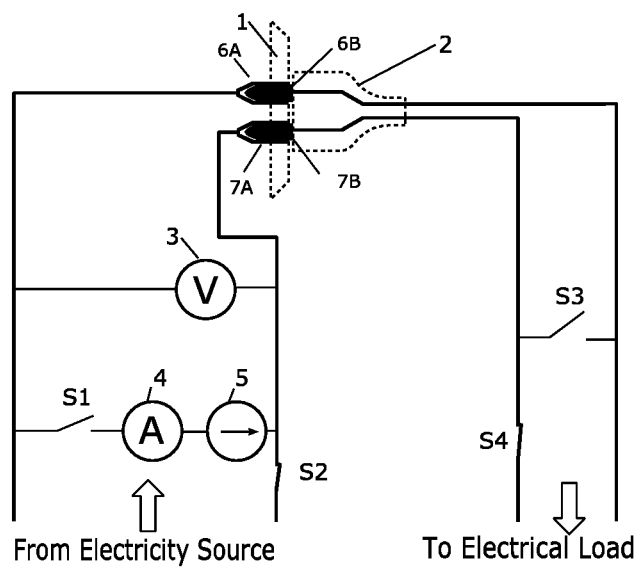
FIG. 7: Electrical power connector with connection quality measurement circuit: Step4

Step 4: Once $Rc6+Rc7$ is verified to be smaller than a predetermined threshold, S1, S3 are "opened" and S2, S4 are "closed". Thus, establishing a safe electrical conduit between electricity source and load. This is shown in FIG. 7.

APPLICATION EXAMPLE

In a realistic example, the two halves (1) and (2) of the connector will be brought together by a robot. Then entire circuit can be fashioned to be under microprocessor control for a fully automated contact check. An electric vehicle (EV) charging robot is one such practical example.

What is presented in this patent application are only few representative embodiments of the core innovation. There are countless situations where this innovation can be applied. Any variant embodiments of this innovation are anticipated by this disclosure and hence are to be considered as part of this patent

What is claimed:

1. A detachable electrical connector with a first and a second half, the first half carrying a first group of n contacts and the second half carrying a second group of n contacts, where n≥2; such that when the first and second half of the connector are made to mate, each contact from the first group mates with one unique member of the contacts from the second group, and:
   a. a first group of $n*(n-1)/2$ single pole switches connected across each possible pair of contacts from the second group of contacts,
   b. a first group of $n*(n-1)/2$ resistance measurement meters connected across each possible pair of contacts from the first group of contacts,
   c. a microprocessor to sequentially turn on every switch from the first group, one at a time and then reading a resistance from corresponding resistance measurement meter from the first group of resistance measurement meters and then turning the said switch off before turning the next switch on.

* * * * *